(12) United States Patent
Zhu (10) Patent No.: US 8,703,577 B1
(45) Date of Patent: Apr. 22, 2014

(54) METHOD FOR FABRICATION DEEP TRENCH ISOLATION STRUCTURE

(71) Applicant: United Microelectronics Corporation, Hsinchu (TW)

(72) Inventor: Meng-Kai Zhu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/717,638

(22) Filed: Dec. 17, 2012

(51) Int. Cl.
 *H01L 21/31* (2006.01)
 *H01L 21/311* (2006.01)
 *H01L 21/76* (2006.01)

(52) U.S. Cl.
 USPC ...... 438/427; 257/501; 257/506; 257/E21.54; 257/E21.546; 257/E21.548; 438/424

(58) Field of Classification Search
 CPC .................................................. H01L 21/76229
 USPC .................... 257/E21.54, 501, 506, E21.546, 257/E21.548; 438/424, 427
 See application file for complete search history.

(56) References Cited

U.S. PATENT DOCUMENTS

| | | | | |
|---|---|---|---|---|
| 6,124,206 A * | 9/2000 | Flietner et al. | ................. | 438/692 |
| 6,150,234 A * | 11/2000 | Olsen | ............................ | 438/424 |
| 6,969,686 B2 * | 11/2005 | Hsieh et al. | .................... | 438/723 |
| 7,550,363 B2 * | 6/2009 | Lee | ................................. | 438/424 |
| 2004/0135198 A1 * | 7/2004 | Murahama | .................... | 257/330 |
| 2004/0183139 A1 * | 9/2004 | Kim | ................................. | 257/374 |
| 2006/0043455 A1 * | 3/2006 | Batra et al. | ..................... | 257/314 |
| 2006/0258098 A1 * | 11/2006 | Lee | ................................. | 438/258 |
| 2007/0026633 A1 * | 2/2007 | Lee | ................................. | 438/424 |
| 2007/0066030 A1 * | 3/2007 | Kim | ................................. | 438/427 |
| 2007/0205438 A1 * | 9/2007 | Juengling | ..................... | 257/216 |
| 2008/0213967 A1 * | 9/2008 | Su et al. | ......................... | 438/386 |
| 2008/0213971 A1 * | 9/2008 | Mitsuhira et al. | ............. | 438/427 |
| 2009/0315096 A1 * | 12/2009 | Wei et al. | ....................... | 257/315 |
| 2010/0184295 A1 * | 7/2010 | Sato et al. | ...................... | 438/702 |
| 2011/0210417 A1 * | 9/2011 | Sandhu | .......................... | 257/510 |
| 2012/0190168 A1 * | 7/2012 | Kao | ................................. | 438/424 |
| 2013/0217173 A1 * | 8/2013 | Chen et al. | ....................... | 438/73 |

FOREIGN PATENT DOCUMENTS

| | | | | | |
|---|---|---|---|---|---|
| JP | 2006269521 A | * | 10/2006 | .............. | H01L 21/76 |
| KR | 20020050468 A | * | 6/2002 | .............. | H01L 21/76 |

* cited by examiner

*Primary Examiner* — Khiem D Nguyen
*Assistant Examiner* — Pauline Vu
(74) *Attorney, Agent, or Firm* — Ding Yu Tan (57) ABSTRACT

A method for fabricating a deep trench isolation structure, wherein the method comprising steps as follows: A first hard mask layer, a second hard mask layer and a third hard mask layer are firstly formed in sequence on a substrate. The third hard mask layer is then patterned using the second hard mask layer as an etching stop layer. Subsequently, a trench etching process is performed using the patterned third hard mask layer as a mask to form a deep trench in the substrate.

9 Claims, 8 Drawing Sheets

METHOD FOR FABRICATION DEEP TRENCH ISOLATION STRUCTURE

FIELD OF THE INVENTION

The present invention relates to a method for fabricating a semiconductor device, and more particularly to a method for fabricating a deep trench isolation structure in a semiconductor substrate.

BACKGROUND OF THE INVENTION

A deep trench isolation structure is typically formed to provide isolation between adjacent active regions of a semiconductor substrate. For example, in a typical Bipolar Complementary-Metal-Oxide-Semiconductor (BiCMOS) process, a deep trench isolation structure may electrically isolate a bipolar transistor from an adjacent Complementary-Metal-Oxide-Semiconductor (CMOS) transistor fabricated on the same semiconductor substrate.

In a conventional deep trench isolation process flow, a plurality of undesirable deep mini-trenches or cavities may be formed on the edges of the silicon substrate. As a result, the integrated circuit devices formed on the substrate may likely suffer from scratch defects due to the undesirable abrasions during a subsequent planarization process.

Therefore, there is a need of providing an improved a method for fabricating the deep trench isolation regions to obviate the drawbacks encountered from the prior art.

SUMMARY OF THE INVENTION

In accordance with an aspect, the present invention provides a method for fabricating a deep trench isolation structure, wherein the method comprising steps as follows: A first hard mask layer, a second hard mask layer and a third hard mask layer are firstly formed in sequence on a substrate. The third hard mask layer is then patterned using the second hard mask layer as an etching stop layer. Subsequently, a trench etching process is performed using the patterned third hard mask layer as a mask to form a deep trench in the substrate.

In one embodiment of the present invention, the method further comprises steps of forming a buffer layer on the substrate before the forming of the first hard mask layer.

In one embodiment of the present invention, the method further comprises steps of forming a shallow trench isolation (STI) structure in the substrate before the forming of the second hard mask layer.

In one embodiment of the present invention, the forming of the STI structure comprises steps as follows: An etching process is performed to form a shallow trench in the first hard mask layer, the buffer layer and the substrate. Next, a first dielectric layer is formed on the first hard mask layer and fills the shallow trench. Subsequently, the first dielectric layer is planarized using the first hard mask layer as a stop layer.

In one embodiment of the present invention, the first dielectric layer is made of silicon nitride and the buffer layer is a pad oxide layer.

In one embodiment of the present invention, the second dielectric layer is a silicon nitride layer.

In one embodiment of the present invention, the third dielectric layer is made of tetraethylorthosilicate (TEOS).

In one embodiment of the present invention, the method further comprises steps of forming a second dielectric layer on the third hard mask layer and filling the deep trench, and planarizing the second dielectric layer using the third hard mask layer as a stop layer.

In accordance with the aforementioned embodiments, a method for fabricating a deep trench isolation structure is provided, wherein a multi-layer hard mask having at least one etching stop layer is provided to cover an active region of a substrate and a peripheral region adjacent to the edge of the substrate. Since the edges of the substrate is covered by the etching stop layer during the hard mask patterning process, thus undesirable deep mini-trenches or cavities may not be formed on the edges of the silicon substrate. As a result, densified TEOS oxide or silicon oxide residuals generated by the subsequent trench etching processes using the patterned multi-layer hard mask as a mask for forming at least one deep trench in the substrate may hardly remained on the edge of the substrate. Whereby, the scratch defects due to the undesirable abrasions of the densified TEOS oxide and high-density plasma silicon residuals during a subsequent planarization process may be obviate, and the yield of the subsequent process for forming a semiconductor device may be improved.

BRIEF DESCRIPTION OF THE DRAWINGS

The above objects and advantages of the present invention will become more readily apparent to those ordinarily skilled in the art after reviewing the following detailed descriptions and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
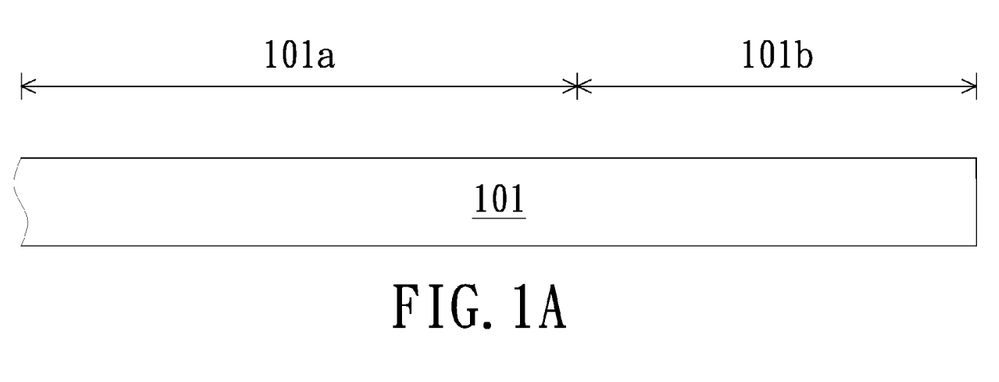
FIGS. 1A~1J are schematic cross-sectional views illustrating a method for fabricating a deep trench isolation structure.

FIGS. 1A-1J are schematic cross-sectional views illustrating a method for fabricating a deep trench isolation structure 100, wherein the method comprises a plurality of steps as follows:

A substrate 101 is firstly provided (see FIG. 1A). In some embodiments of the present invention, the substrate 101 may be a silicon substrate or a silicon-on-insulator (SOI) substrate. In the present embodiment, the substrate 101 is a silicon wafer having an active region 101a and a peripheral region 101b, wherein the active region 101a may be divided into a plurality of chips (not shown) on which at least one integrated circuit device used to perform certain functions is formed, and the peripheral region 101b is disposed adjacent to the edge of the silicon wafer. In some embodiments of the present invention, no intact chip is formed on the peripheral region 101b.

Figure 1B:
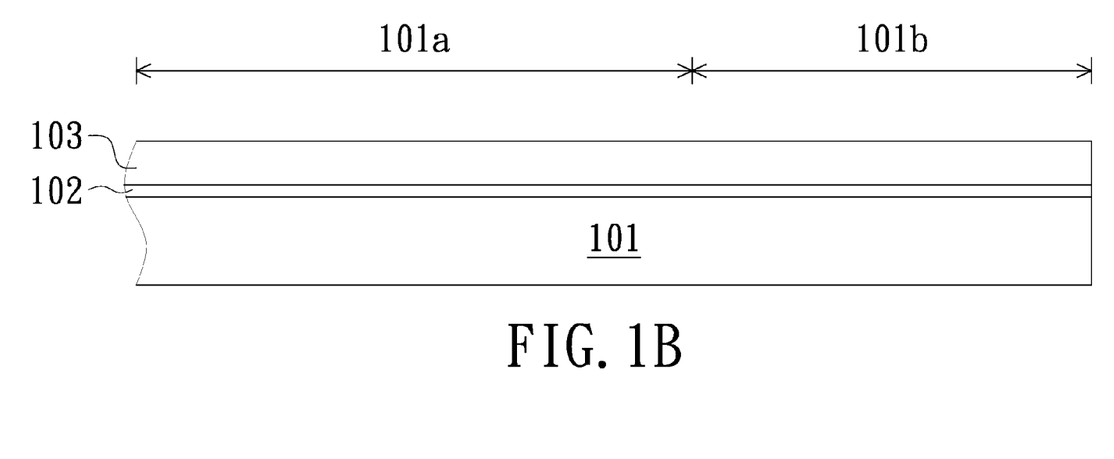

Next, a buffer layer 102 is formed on the silicon substrate 101 Next, and then a first hard mask layer 103 is formed on the buffer layer 102 (see FIG. 1B). In some embodiments of the present invention, the buffer layer 102 is a pad oxide layer formed by a chemical vapor deposition (CVD) process. The first hard mask layer 103 is made of silicon nitride.

Figure 1C:
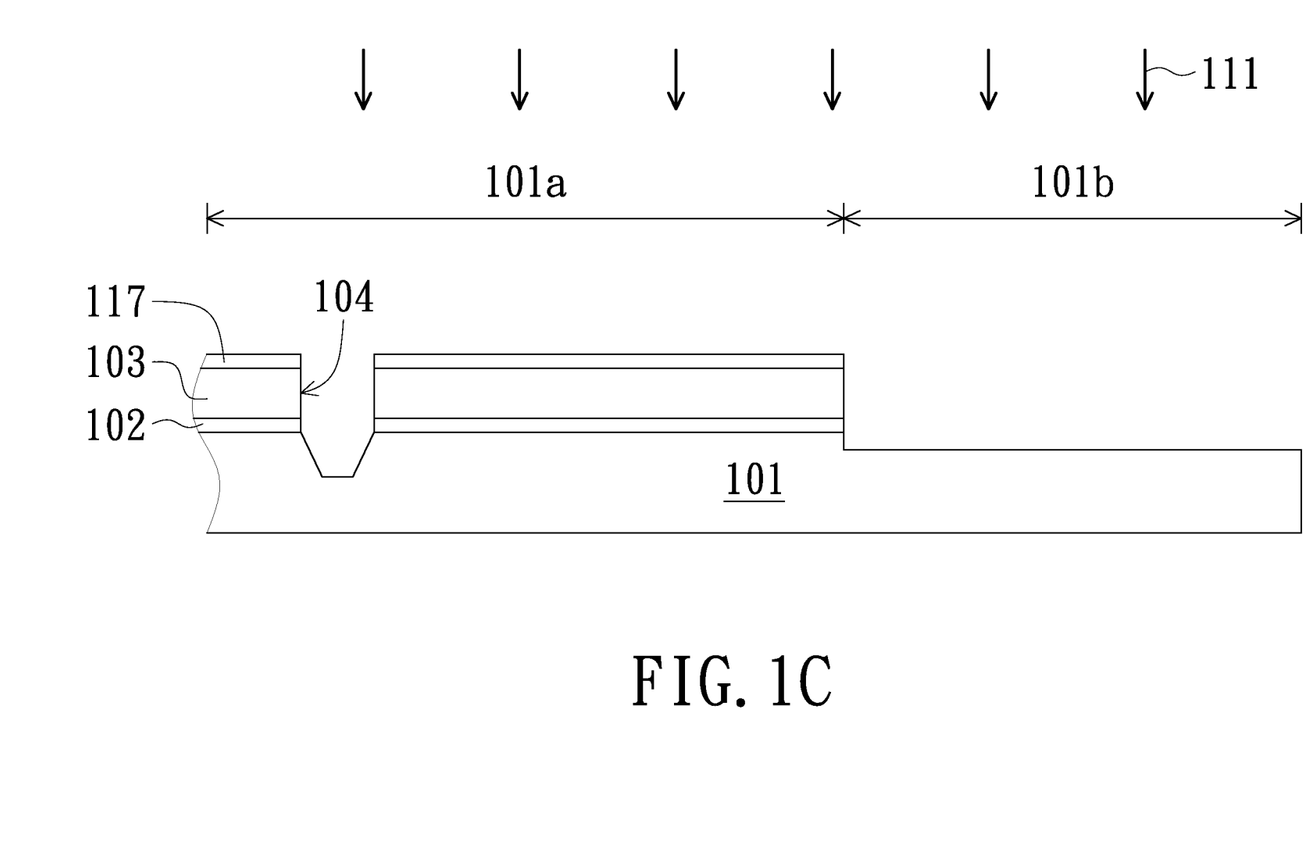
Figure 1D:
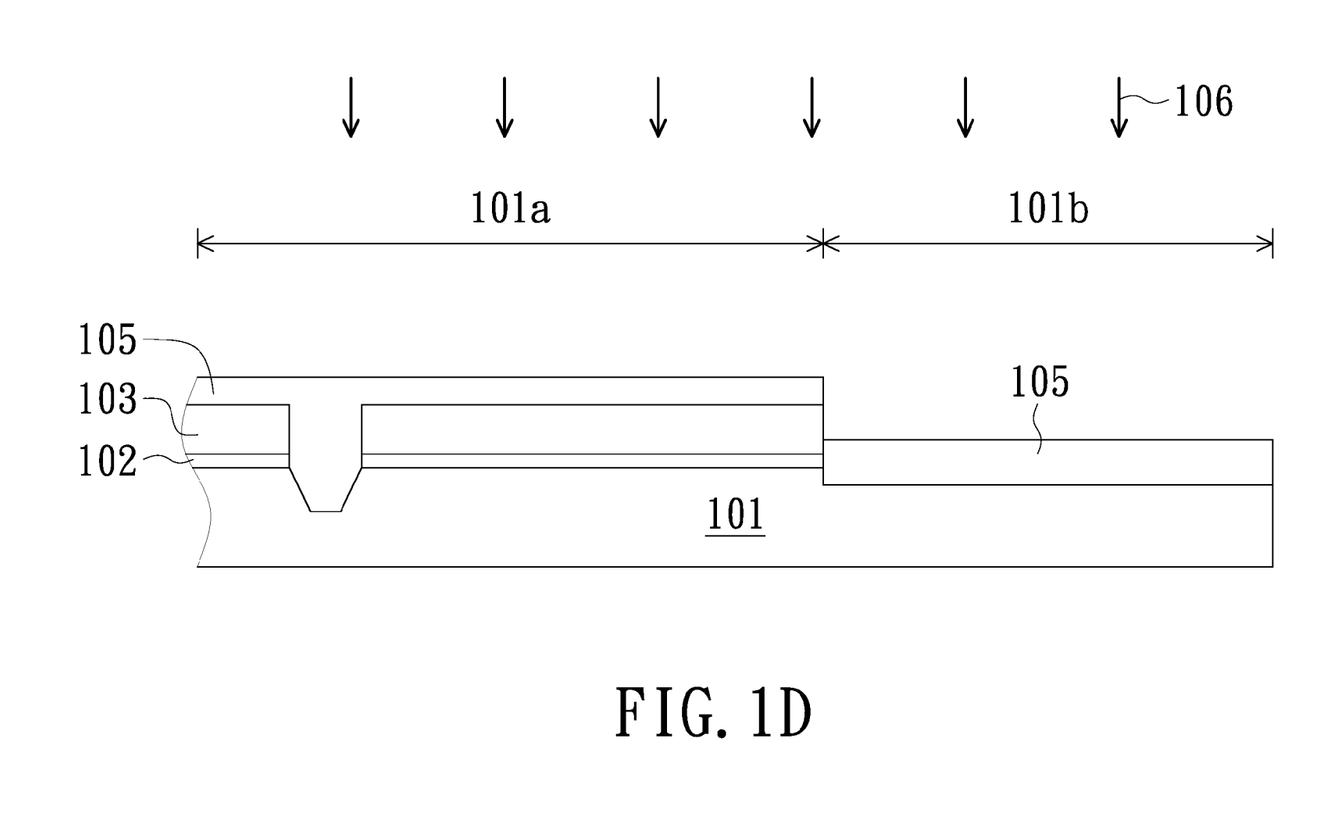

Subsequently, a photoresist layer 117 is formed on the first hard mask layer 103 and a lithography/etching process 111 is performed to form at least one shallow trench 104 penetrating through the first hard mask layer 103 and the buffer layer 102 and further extending downward into the substrate 101 (see FIG. 1C). In some embodiments of the present invention, after the photoresist layer 117 is patterned, the portion of the first hard mask layer 103 formed on the peripheral region 101b may be exposed from the patterned photoresist layer 117. As a result, the portions of the first hard mask layer 103 and the buffer layer 102 formed on the peripheral region 101b may be removed by the lithography/etching process 111.

A first dielectric layer 105 is then formed on the substrate 101 and the first hard mask layer 103, so as to fill the shallow trench 104. In some embodiments of the present invention, the first dielectric layer 105 is made of silicon oxide or silicon nitride. In the present embodiment, the first dielectric layer 105 is a silicon oxide layer covering on the first hard mask layer 103 and the peripheral region 101b of the substrate 101. Subsequently, a planarization process 106, such as a chemical mechanical polishing (CMP), is performed to remove a portion of the first dielectric layer 105 using the first hard mask layer 103 as a stop layer (see FIG. 1D), so as to form a STI structure 107 substantially conforming to the first hard mask layer 103 (see FIG. 1E).

Figure 1E:
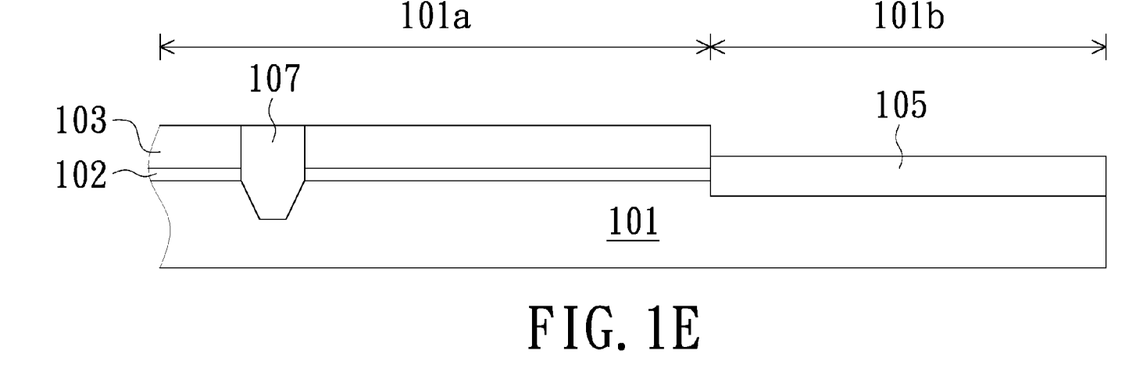

However, it should be noted that since merely the active region 101a of the substrate 101 has portions of the buffer layer 102 and the first hard mask layer 103 remained thereon, thus there exists a step height between the active region 101a and the peripheral region 101b. While the first dielectric layer 105 is formed on the active region 101a and the peripheral region 101b, it may be divided into two portions, in which one portion is formed on the active region 101a and the other portion is formed on the peripheral region 101b of the substrate 101, due to the step height that is found in between the two portions of the first dielectric layer 105. In the present embodiment, merely the portion of the first dielectric layer 105 that is formed on the first hard mask layer 103 is being removed by the planarization process 106, and the portion of the first dielectric layer 105 that is formed on the peripheral region 101b is remained.

Figure 1F:
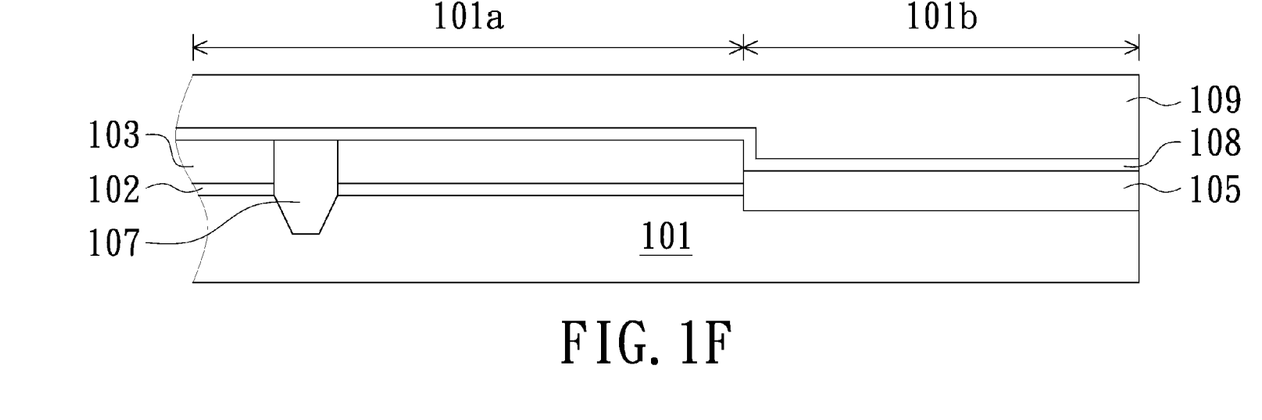

After the planarization process 106 is carried out, a second hard mask layer 108 and a third hard mask layer 109 are formed in sequence on the first hard mask layer 103, the STI structure 107 and the portion of the first dielectric layer 105 formed on the peripheral region 101b (see FIG. 1F). In some embodiments of the present invention, the second hard mask layer 108 may be made of silicon nitride and has a thickness thereof less than that of the first hard mask layer 103.

Figure 1G:
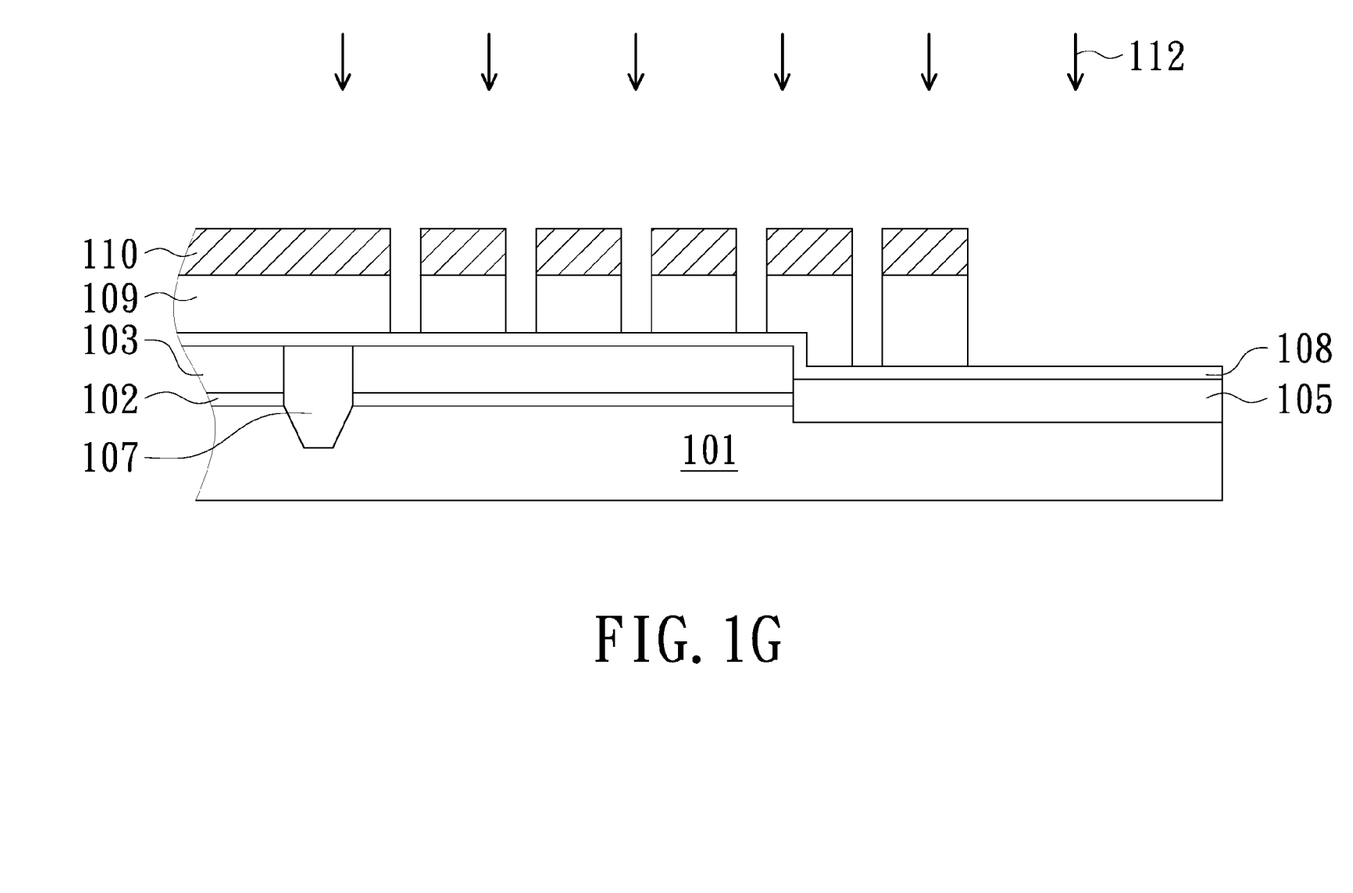
Figure 1H:
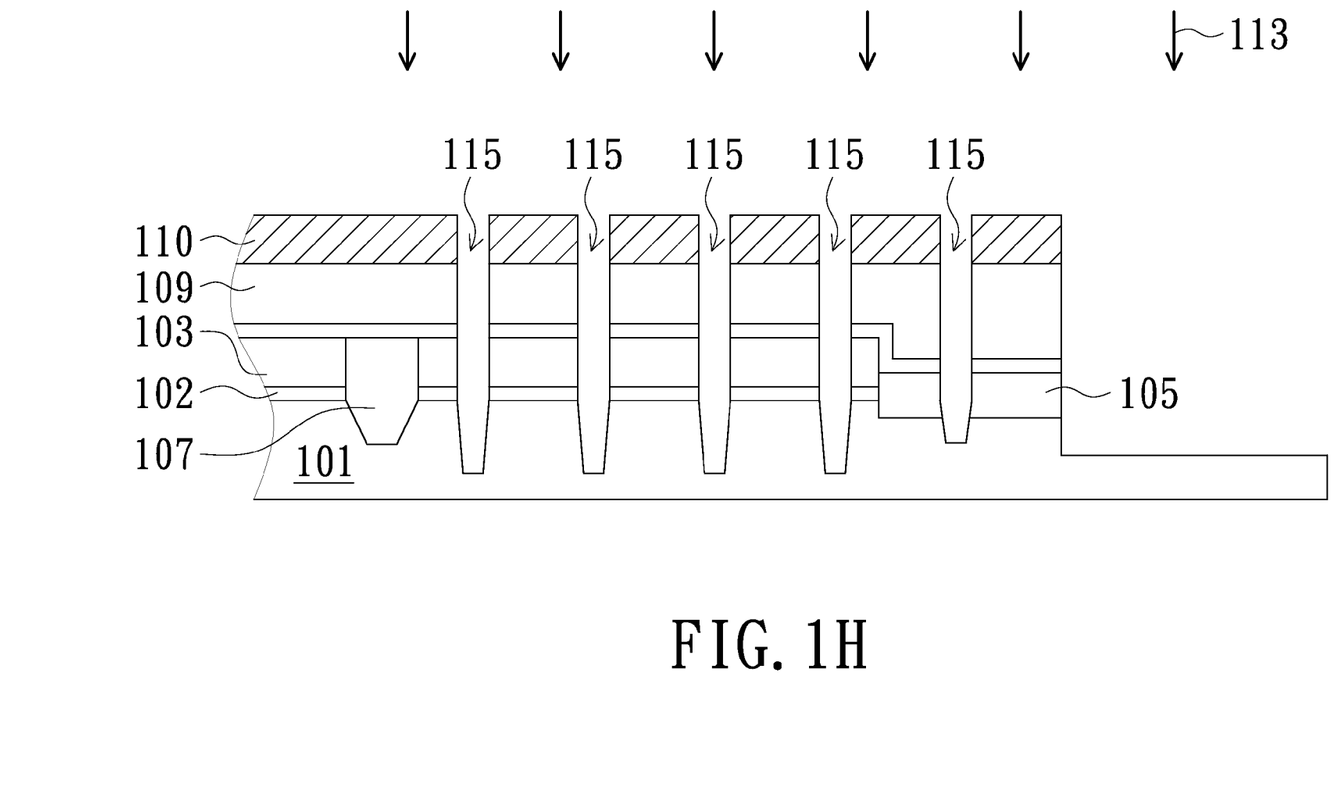
Figure 1I:
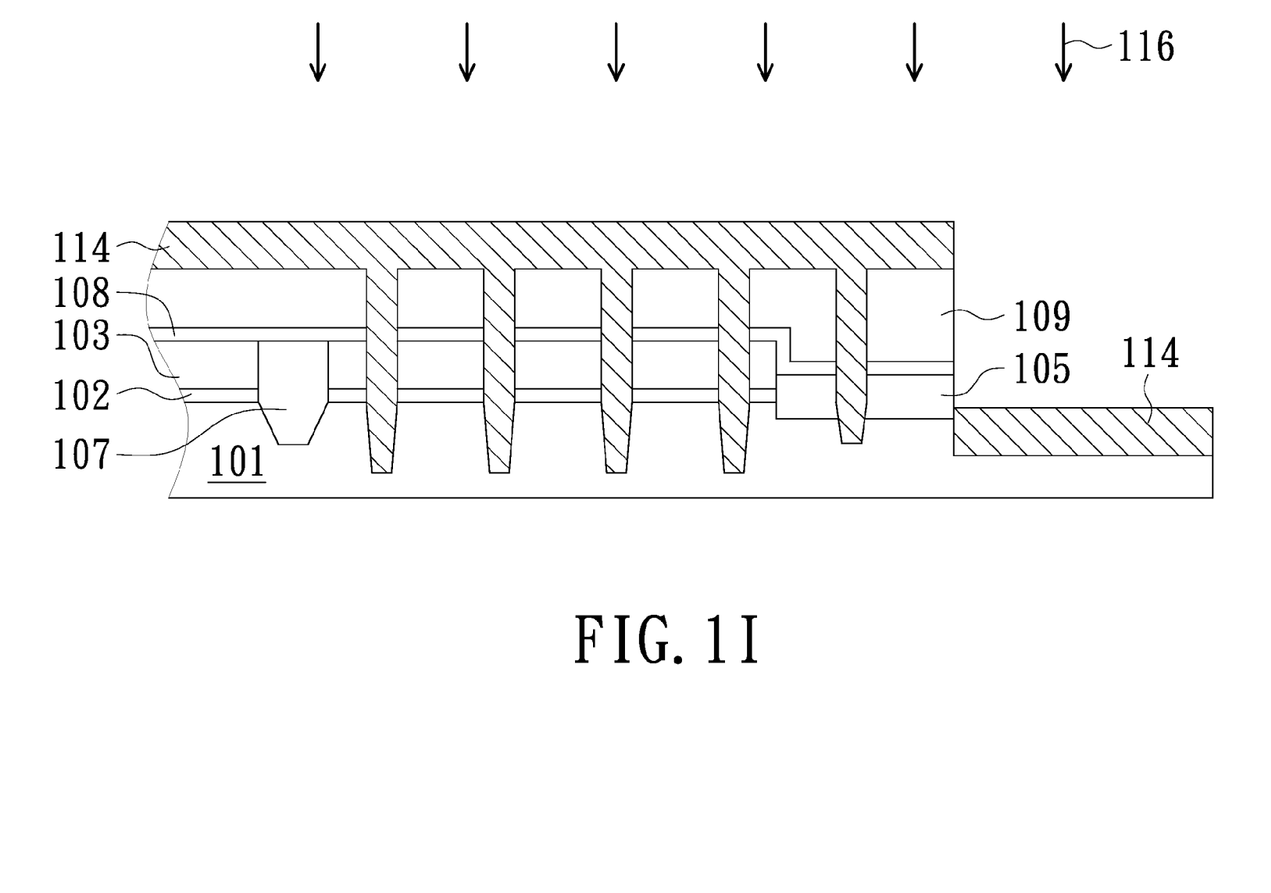
Figure 1J:
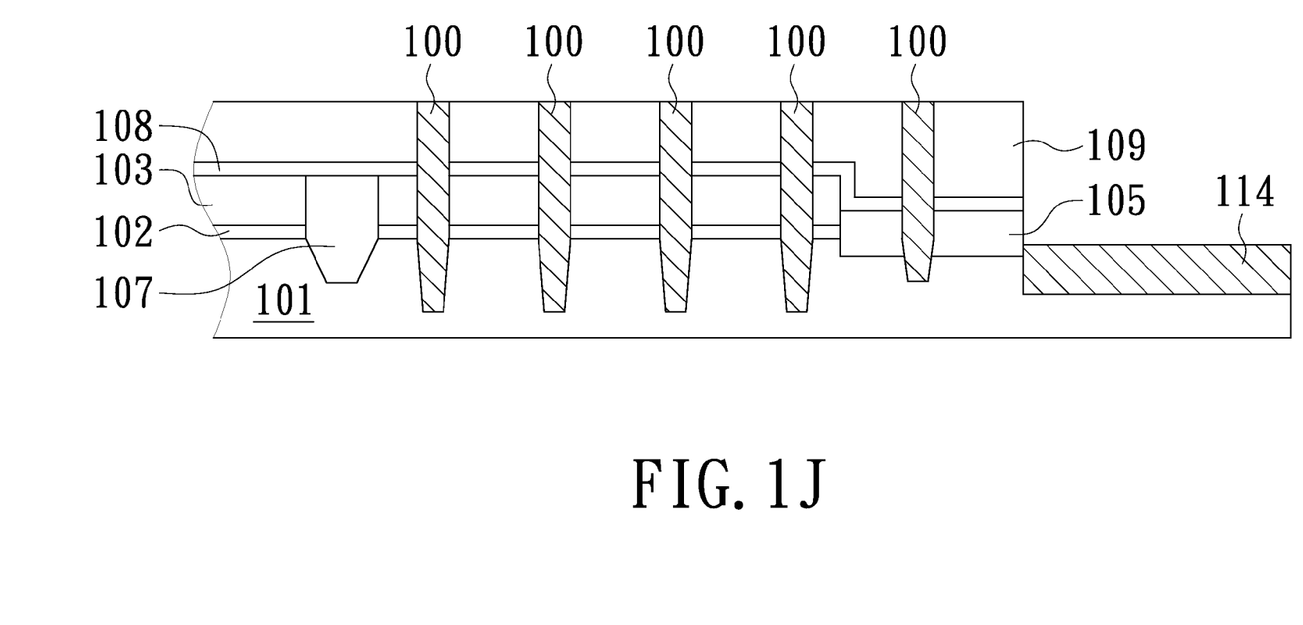

Thereafter, a patterned photoresist layer 110 is formed on the third hard mask layer 109, and an etching process 112 using the second hard mask layer 108 as an etch-stop layer is then performed, whereby the pattern of the patterned photoresist layer 110 can be transferred to the third hard mask layer 109 (see FIG. 1G). A trench etching process 113 using the patterned third hard mask layer 109 as a mask is subsequently performed to form a deep trench 115 penetrating the second hard mask layer 108, the first hard mask layer 103 and the buffer layer 102 and further extending downwards into the substrate 101 (see FIG. 1H). In some embodiments of the present invention, the trench etching process 113 preferably is a dry etching process. In the present embodiment, the trench etching process 113 is a reactive ion etching (RIE) process.

Next, a second dielectric layer 114 is formed on the third hard mask layer 109 and fills the deep trench 115. In some embodiments of the present invention, the second dielectric layer 114 may be made of silicon oxide, silicon nitride or other suitable materials. Another planarization process 116 using the third hard mask layer 109 as a stop layer is then performed (see FIG. 1I) to form a plurality of deep trench isolation structures 100 shown in FIG. 1J. Subsequently, some other downstream processes are performed to form the semiconductor device having the integrated circuit perform certain functions.

Since the portion of the first dielectric layer 105 that is formed on the peripheral region 101b is covered by the second hard mask layer 108, during the third hard mask layer 109 patterning processes (etching process 112), thus undesirable deep mini-trenches or cavities cannot be formed on the peripheral region 101b by the etching process 112 for patterning the third hard mask layer 109, and densified TEOS oxide or silicon oxide residuals generated by the trench etching process 113 may not have been remained on the peripheral region 101b. As a result, the active region 101a may not subject to undesirable abrasions due to the densified TEOS oxide or silicon oxide residuals during the planarization process 116.

In accordance with the aforementioned embodiments, a method for fabricating a deep trench isolation structure is provided, wherein a hard mask layer having at least one etching stop layer is provided to cover an active region of a substrate and a peripheral region adjacent to the edge of the substrate. Since the edges of the substrate is covered by the etching stop layer during the hard mask layer patterning process, thus undesirable deep mini-trenches or cavities may not be formed on the edges of the silicon substrate. As a result, densified TEOS oxide or silicon oxide residuals generated by the subsequent trench etching processes using the patterned multi-layer hard mask as a mask for forming at least one deep trench in the substrate may hardly be remained on the edge of the substrate. Whereby, the scratch defects due to the undesirable abrasions of the densified TEOS oxide and high-density plasma silicon residuals occurring during a subsequent planarization process may be obviate, and the yield of the subsequent process for forming a semiconductor device may be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a deep trench isolation structure, the method comprising steps as follows:
   providing a substrate at least having an active region and a peripheral region;
   forming a first hard mask layer on the substrate;
   removing a portion of the first hard mask layer at least to expose a portion of the substrate disposed in the peripheral region;
   forming a first dielectric layer to cover the exposed portion of the substrate;
   forming a second hard mask layer and a third hard mask layer in sequence on the first hard mask layer and the first dielectric layer;
   patterning the third hard mask layer using the second hard mask layer as an etching stop layer; and
   performing a trench etching process using the patterned third hard mask layer as a mask to form a deep trench in the substrate.

2. The method according to claim 1, further comprising steps of forming a buffer layer on the substrate before the forming of the first hard mask layer.

3. The method according to claim 2, further comprising steps of forming a shallow trench isolation (STI) structure in the substrate before the forming of the second hard mask layer.

4. The method according to claim 3, wherein the forming of the STI structure comprises steps as follows:
   performing an etching process to form a shallow trench in the first hard mask layer, the buffer layer and the substrate;
   filling the shallow trench with a portion of the first dielectric layer; and
   planarizing the first dielectric layer using the first hard mask layer as a stop layer.

5. The method according to claim 2, wherein the first hard mask layer is made of silicon nitride and the buffer layer is a pad oxide layer.

6. The method according to claim 1, wherein the second hard mask layer is a silicon nitride layer.

7. The method according to claim 1, wherein the third hard mask layer is made of tetraethylorthosilicate (TEOS) oxide.

8. The method according to claim 1, further comprising steps as follows:
   forming a second dielectric layer on the third hard mask layer and filling the deep trench; and
   planarizing the second dielectric layer using the third hard mask layer as a stop layer.

9. The method according to claim 1, wherein there exists a step height between the active region and the peripheral region, after the steps of the removing the portion of the first hard mask layer at least to expose the portion of the substrate disposed in the peripheral region.

\* \* \* \* \*